United States Patent
Lee et al.

(10) Patent No.: US 9,194,889 B2
(45) Date of Patent: Nov. 24, 2015

(54) PROBE CARD AND MANUFACTURING METHOD THEREOF

(75) Inventors: Hak Joo Lee, Daejeon (KR); Jung Yup Kim, Daejeon (KR); Jun-Hyub Park, Seongnam-si (KR)

(73) Assignee: KOREA INSTITUTE OF MACHINERY & MATERIALS, Daejeon (KR)

( * ) Notice: Subject to any disclaimer, the term of this patent is extended or adjusted under 35 U.S.C. 154(b) by 183 days.

(21) Appl. No.: 13/821,045

(22) PCT Filed: Sep. 7, 2011

(86) PCT No.: PCT/KR2011/006615
§ 371 (c)(1), (2), (4) Date: Mar. 6, 2013

(87) PCT Pub. No.: WO2012/033338
PCT Pub. Date: Mar. 15, 2012

(65) Prior Publication Data
US 2013/0162276 A1    Jun. 27, 2013

(30) Foreign Application Priority Data

Sep. 7, 2010 (KR) ........................ 10-2010-0087598

(51) Int. Cl.
*G01R 31/20* (2006.01)
*G01R 1/073* (2006.01)
*G01R 3/00* (2006.01)

(52) U.S. Cl.
CPC ........ *G01R 1/07307* (2013.01); *G01R 1/07342* (2013.01); *G01R 1/07378* (2013.01); *G01R 3/00* (2013.01); *Y10T 29/49126* (2015.01)

(58) Field of Classification Search
CPC ........... G01R 1/07342; G01R 1/06772; G01R 1/07378; G01R 31/2886
See application file for complete search history.

(56) References Cited

U.S. PATENT DOCUMENTS

| | | | |
|---|---|---|---|
| 5,631,573 A | | 5/1997 | Ohno |
| 5,998,864 A | * | 12/1999 | Khandros et al. ............. 257/723 |
| 6,710,608 B2 | | 3/2004 | Yoshida |
| 6,900,647 B2 | | 5/2005 | Yoshida |
| 6,903,563 B2 | | 6/2005 | Yoshida |
| 6,917,211 B2 | | 7/2005 | Yoshida |
| 6,919,732 B2 | | 7/2005 | Yoshida |

(Continued)

FOREIGN PATENT DOCUMENTS

| | | |
|---|---|---|
| CN | 1113604 | 12/1995 |
| JP | 04-184264 | 7/1992 |

(Continued)

OTHER PUBLICATIONS

PCT Search Report & Written Opinion of PCT/KR2011/006615 dated Apr. 24, 2012.

*Primary Examiner* — Arleen M Vazquez
*Assistant Examiner* — Dominic Hawkins
(74) *Attorney, Agent, or Firm* — Lex IP Meister, PLLC

(57) ABSTRACT

Provided is a probe card including a plurality of unit plates including pad areas and contact probe areas, a plurality of electrode pads formed in the pad areas, a plurality of contact probes formed in the contact probe areas, and a plurality of interconnecting layers electrically connecting the electrode pads and the contact probes. The plurality of unit plates has different sizes and are arranged and laminated so as to expose all the pad areas of each unit plate.

20 Claims, 18 Drawing Sheets

(56) References Cited

U.S. PATENT DOCUMENTS

| | | |
|---|---|---|
| 6,937,042 B2 | 8/2005 | Yoshida |
| 7,015,710 B2 | 3/2006 | Yoshida |
| 2001/0019276 A1 | 9/2001 | Yoshida |
| 2008/0048689 A1* | 2/2008 | Lee ............... 324/754 |
| 2008/0048698 A1* | 2/2008 | Amemiya et al. ........... 324/758 |
| 2008/0116917 A1* | 5/2008 | Kanev et al. .................. 324/754 |
| 2009/0002005 A1* | 1/2009 | Yoo et al. ...................... 324/754 |
| 2009/0167334 A1* | 7/2009 | Fjelstad et al. ............... 324/754 |
| 2009/0174422 A1* | 7/2009 | Machida ....................... 324/754 |
| 2009/0223043 A1* | 9/2009 | Hsu et al. ....................... 29/830 |
| 2009/0289651 A1* | 11/2009 | Caldwell ....................... 324/758 |
| 2010/0104739 A1* | 4/2010 | Lu .................................. 427/58 |
| 2010/0109698 A1* | 5/2010 | Hsu ............................... 324/762 |
| 2010/0182028 A1* | 7/2010 | Ni et al. ........................ 324/754 |
| 2011/0121851 A1* | 5/2011 | Lee et al. ................. 324/756.03 |
| 2011/0163774 A1* | 7/2011 | Minami et al. ........... 324/756.03 |
| 2012/0068726 A1* | 3/2012 | Hayashizaki et al. ... 324/755.01 |
| 2014/0091826 A1* | 4/2014 | Chui ........................ 324/756.03 |

FOREIGN PATENT DOCUMENTS

| | | |
|---|---|---|
| JP | 10-111316 | 4/1998 |
| JP | 10-160759 | 6/1998 |
| JP | 10-319044 | 12/1998 |
| JP | 11-337579 | 12/1999 |
| JP | 2004-085281 | 3/2004 |
| JP | 2006-266697 | 10/2006 |
| JP | 2010-135635 | 6/2010 |
| KR | 2000-0035647 | 6/2000 |
| KR | 10-2008-0109270 | 12/2008 |
| KR | 10-2009-0050387 | 5/2009 |
| KR | 10-0927157 | 11/2009 |
| KR | 10-2010-0019870 | 2/2010 |

* cited by examiner

FIG.5
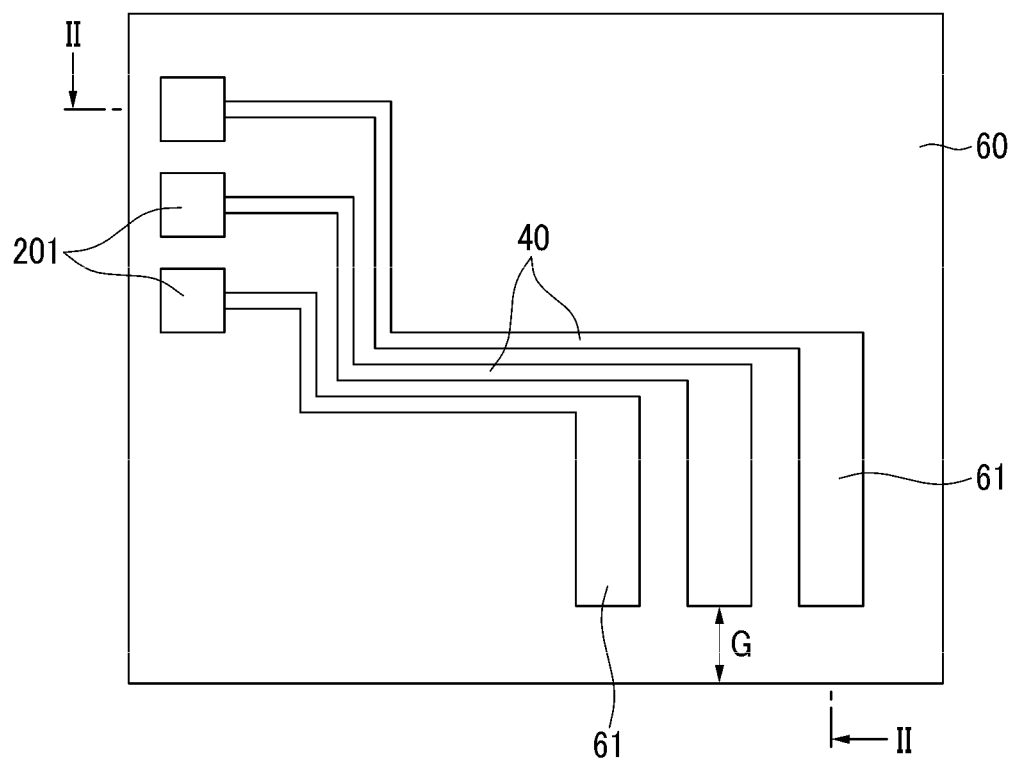
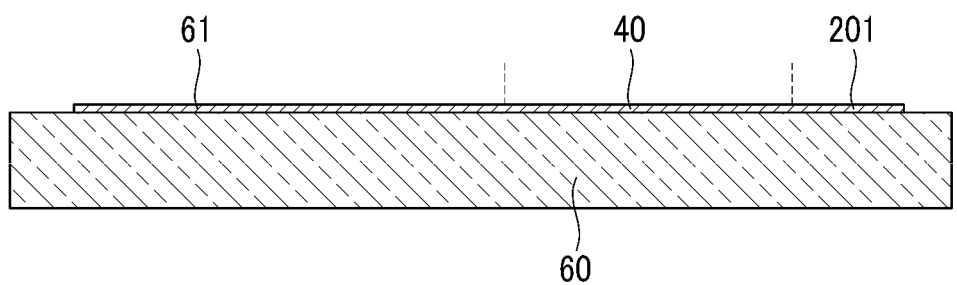

FIG.6
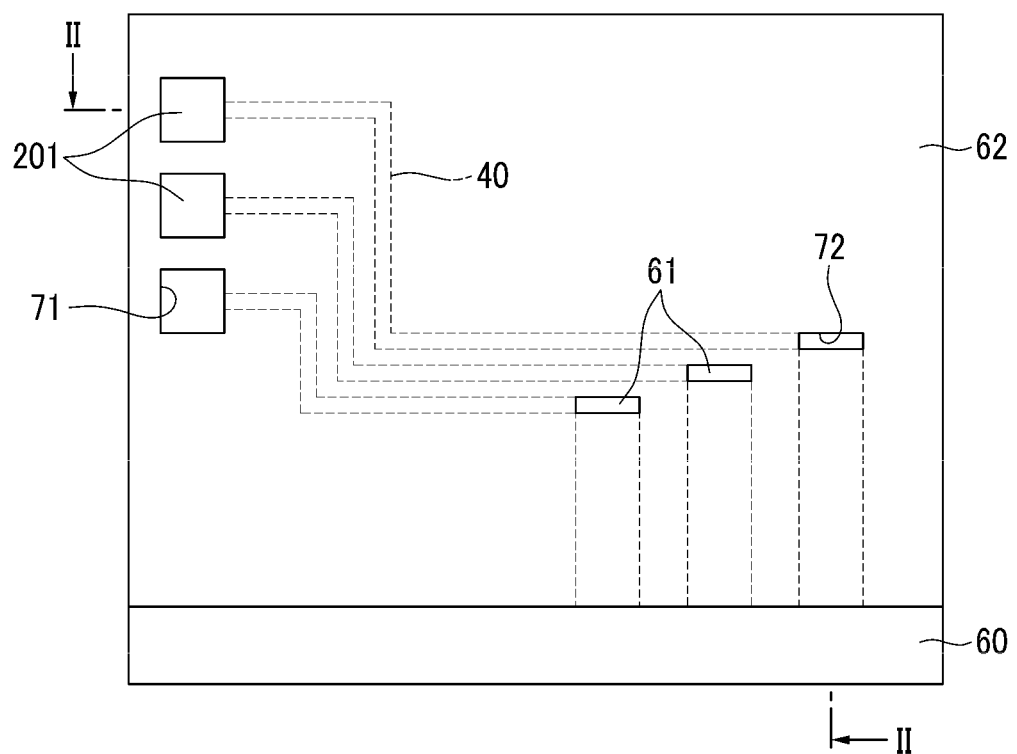
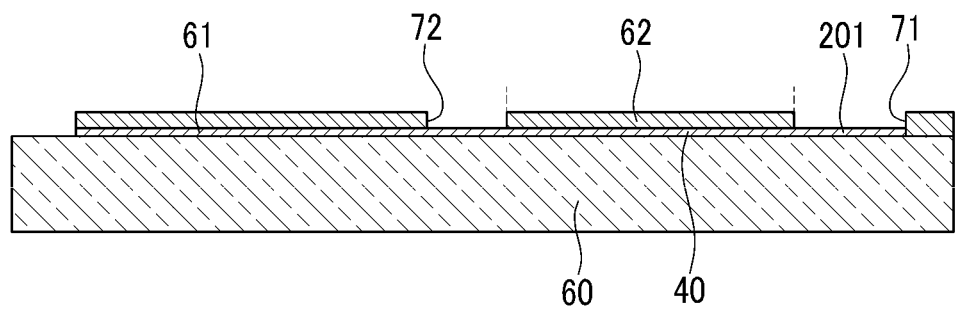

FIG.7
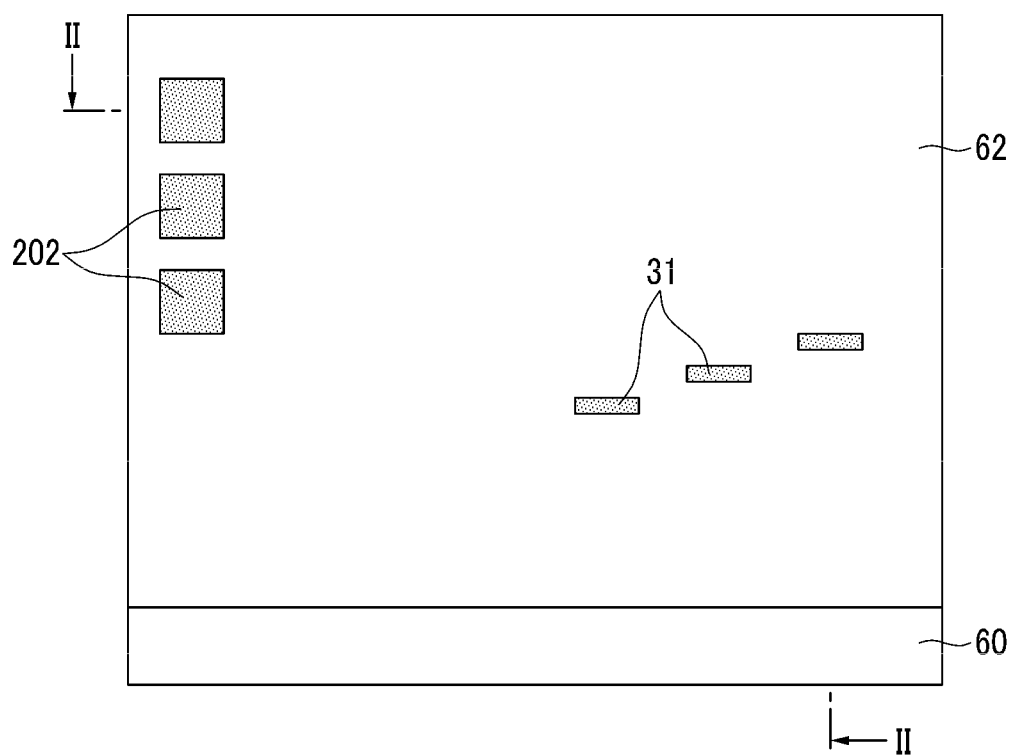
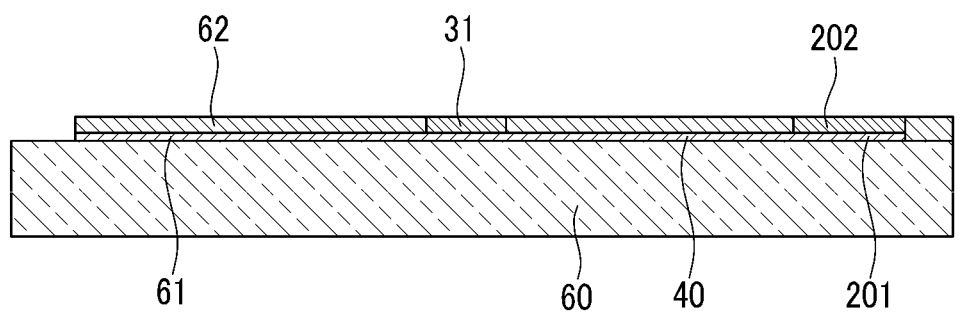

FIG.11
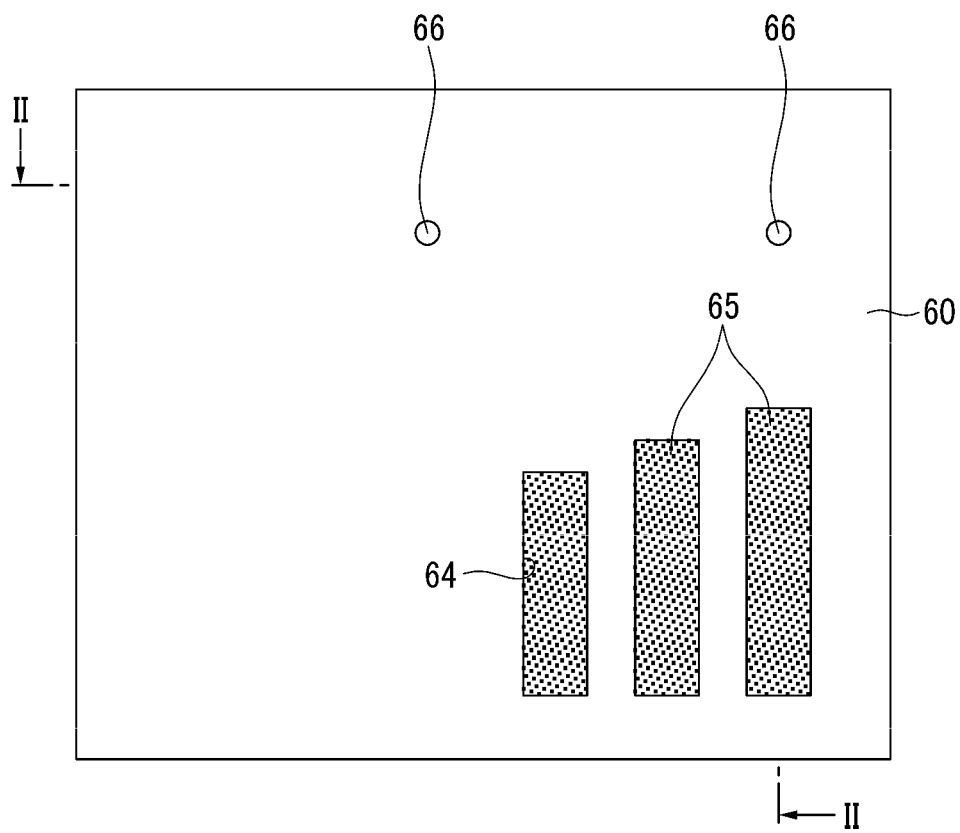
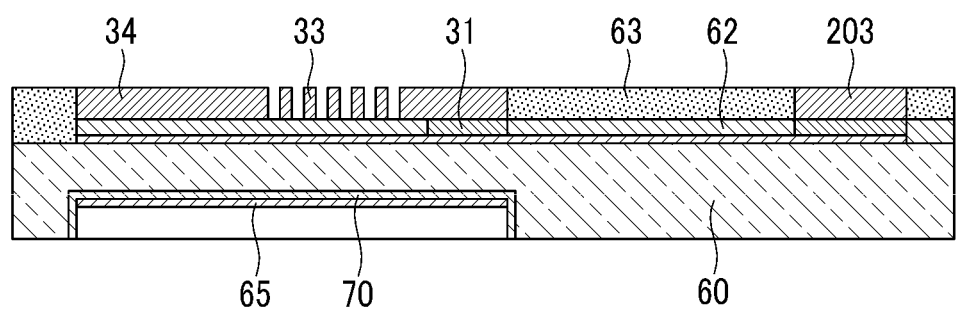

FIG.12
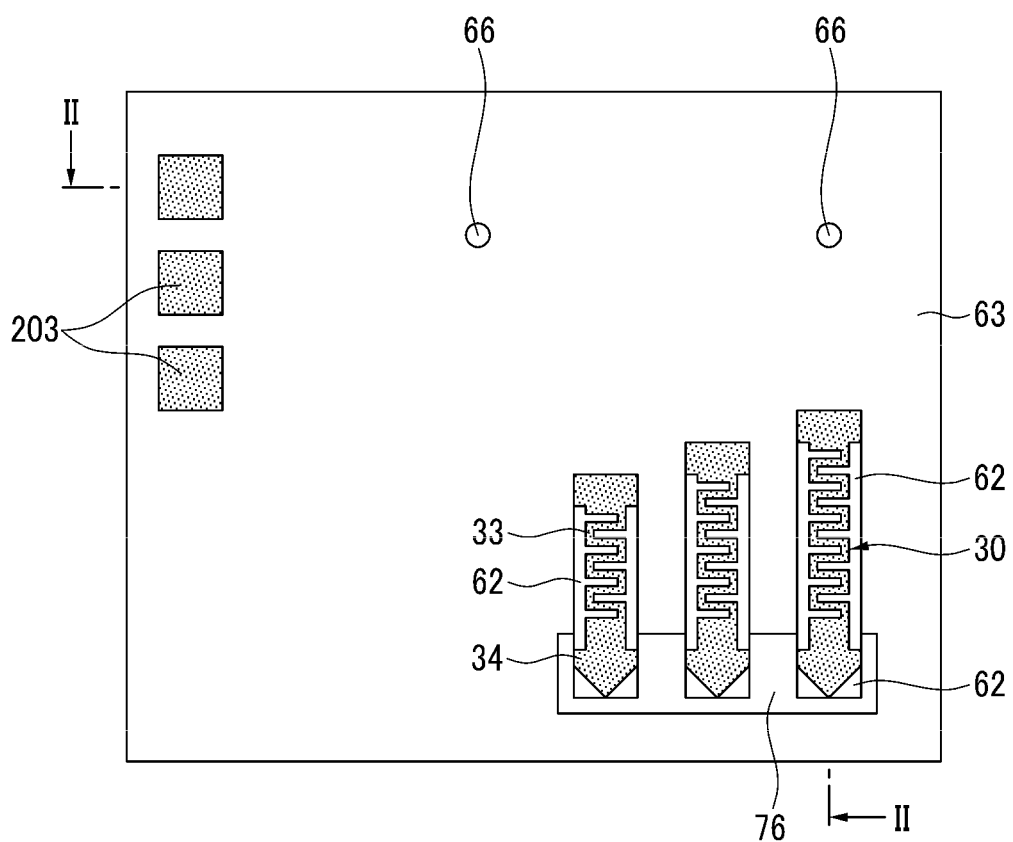
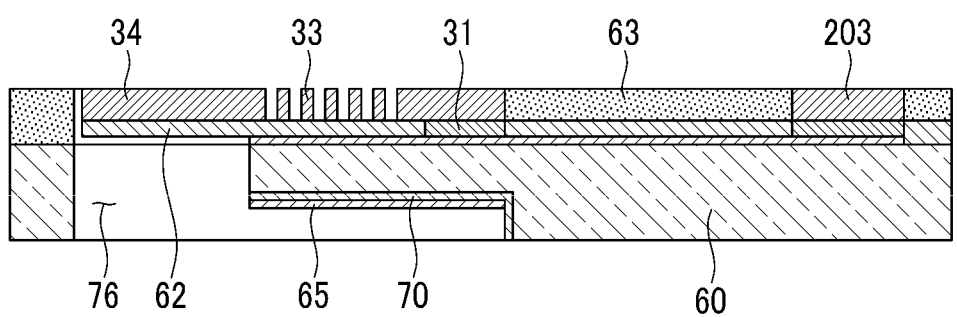

FIG.13
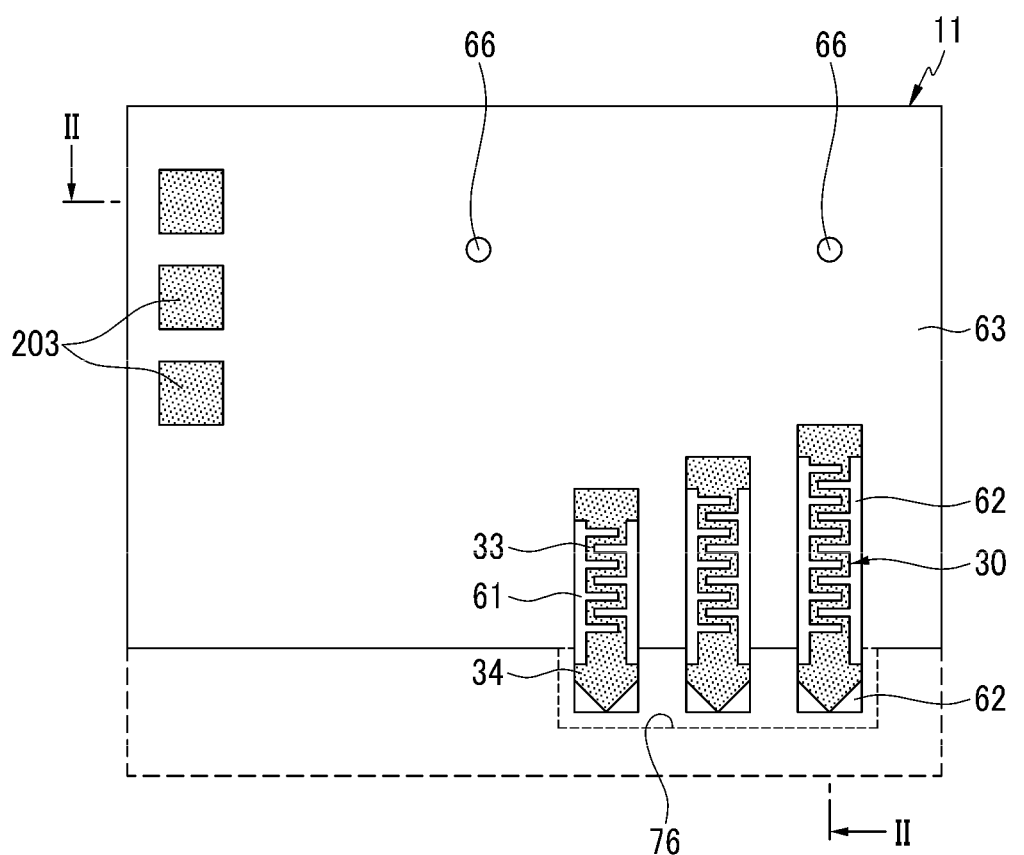
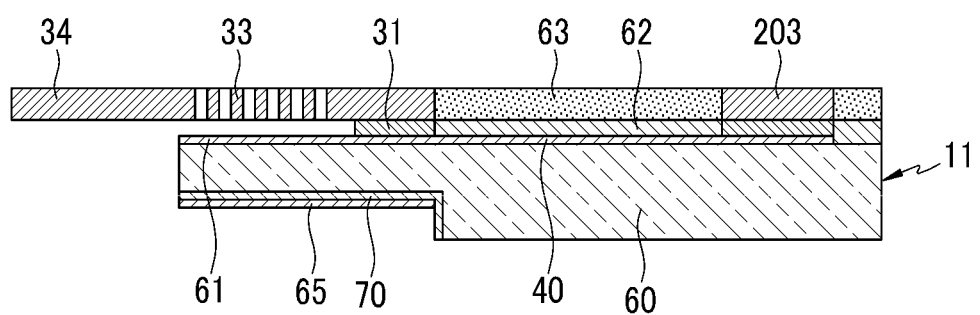

PROBE CARD AND MANUFACTURING METHOD THEREOF

CROSS-REFERENCE TO RELATED APPLICATION

This application is a National Stage application of PCT/KR2011/006615 filed on Sep. 7, 2011, which claims priority to and the benefit of Korean Patent Application No. 10-2010-0087598 in the Korean Intellectual Property Office on Sep. 7, 2010, the entire contents of which are incorporated herein by reference.

TECHNICAL FIELD

The present invention relates to a probe card, and more particularly, to a probe card including an inspection circuit while high-densely arranging a plurality of contact probes for inspecting a highly integrated semiconductor chip, and a manufacturing method thereof.

BACKGROUND ART

Generally, a manufactured semiconductor chip performs an electrical inspection before packaging and after packaging, and good products are packaged and bad products are discarded according to the inspection result before packaging. A probe card which electrically connects a tester embedding a measuring device and an electrode pad of the semiconductor chip is used for the electrical inspection.

A plurality of contact probes which is in contact with each electrode pad of the semiconductor chip to be electrically connected with the each electrode pad protrudes from the probe card. Each contact probe is connected with an electrode pad of the probe card through a interconnecting layer, and the plurality of electrode pads is electrically connected with a tester to receive an electric signal required for inspection from the tester.

Recently, with the development of a semiconductor technique, a semiconductor chip having a plurality of electrode pads is formed on a single wafer. As a result, during an electrical inspection performing a test by a wafer unit, the number of semiconductor chips and electrode pads to be tested is increased, and accordingly, the number of contact probes included in the probe card needs to be increased.

However, it is difficult to form a plurality of contact probes enough to test all semiconductor chips of a wafer by one process in one probe card, due to a manufacturing process. Accordingly, in the related art, an area to be tested for a large-area wafer are divided into a plurality unit areas, and a testing method is sequentially applied to respective unit areas. However, in this case, there are shortcomings in that a test process becomes complicated and a lot of time for testing is required.

DISCLOSURE

Technical Problem

The present invention has been made in an effort to provide a probe card and a manufacturing method thereof having advantages of reducing a pitch between contact probes and increasing the number of contact probes to inspect all semiconductor chips by one test process with respect to a large-area wafer.

Technical Solution

An exemplary embodiment of the present invention provides a probe card, including: a plurality of unit plates including pad areas and contact probe areas; a plurality of electrode pads formed in the pad areas; a plurality of contact probes formed in the contact probe areas; and a plurality of interconnecting layers electrically connecting the electrode pads and the contact probes. The plurality of unit plates has different sizes and are arranged and laminated so as to expose all the pad areas of each unit plate.

The contact probe areas may have the same width and the plurality of contact probes may have the same number as the plurality of unit plates. The plurality of unit plates may be arranged so that the plurality of contact probes is positioned in a row in a thickness direction of each of the unit plates.

The unit plate may have a recess portion formed on the rear side facing the contact probe of the adjacent unit plate. The plurality of unit plates may further include an insulating layer positioned on the recess portion and a lubricating layer positioned on the insulating layer and made of a conductive material.

On the other hand, the plurality of unit plates may further include an insulating layer formed on the rear side facing the adjacent unit plate and a side wall positioned between the pluralities of contact probes.

The plurality of unit plates may further include an inspection circuit, and the interconnecting layers may be positioned between the electrode pad and the inspection circuit and between the inspection circuit and the contact probe.

Another embodiment of the present invention provides a probe card, including: i) a plurality of unit plates including pad areas and contact probe areas and having different sizes, in which the contact probe areas are overlapped with each other and arranged and laminated so that all the pad areas are exposed; ii) a plurality of electrode pads formed in the pad areas; iii) a plurality of contact probes formed in the contact probe areas; and iv) a plurality of interconnecting layers electrically connecting the electrode pads and the contact probes. In the plurality of unit plates, the pad areas are formed at two sides facing each other in a first direction, and the contact probe area is formed at any one side of two sides facing each other in a second direction perpendicular to the first direction.

The plurality of unit plates may include a first unit plate and a second unit plate contacting the first unit plate, and a size of the second unit plate may be equal to a sum obtained by adding a size of the two pad areas to the size of the first unit plate.

In the plurality of unit plates, the pad area may be further formed at another side of the two sides facing each other in the second direction. In this case, a size of the second unit plate may be equal to a sum obtained by adding a size of the three pad areas to the size of the first unit plate.

The probe card may further include a fixing member fixing integrally the plurality of unit plates. The fixing member may include at least one of an assembly of at least two bolts passing through the plurality of unit plates and nuts coupled with the bolts and an adhesive layer positioned between the pluralities of unit plates.

The probe card may further include a first protection plate positioned at the outside of a top unit plate among the plurality of unit plates and a second protection plate positioned at the outside of a lowest unit plate of the plurality of unit plates. The first protection plate and the second protection plate may be integrally fixed to the plurality of unit plates by the fixing member.

The first protection plate may have a smaller size than the top unit plate, and the second protection plate may have the same size as the lowest unit plate. The first protection plate and the second protection plate may have a larger size than the each unit plate.

The plurality of electrode pads may be arranged in the second direction and the plurality of contact probes is arranged in the first direction, and the interconnecting layer may include a first horizontal portion contacting the electrode pad, a second horizontal portion contacting the contact probe, and a connector connecting the first horizontal portion and the second horizontal portion.

The first horizontal portion and the second horizontal portion may be parallel to the first direction, and the connector may be parallel to the second direction or obliquely positioned in the second direction. A pitch of the first horizontal portion may be larger than a pitch of the second horizontal portion, and a pitch of the connector may be equal to the pitch of the second horizontal portion or set as an intermediate value between the pitch of the first horizontal portion and the pitch of the second horizontal portion.

The second horizontal portions may have different lengths, ends of the second horizontal portions may have different heights in the second direction, and the plurality of contact probes may have different lengths from the adjacent contact probes.

Another embodiment of the present invention provides a manufacturing method of a probe card, including: forming a first layer of an electrode pad, a interconnecting layer, and a base layer on a substrate; forming a sacrificial layer having a first opening exposing the first layer and a second opening exposing a part of the base layer, on the substrate; forming a second layer of the electrode pad and a protrusion of the contact probe by filling a conductive material in the first opening and the second opening; forming a mold layer having a third opening exposing the second layer and a fourth opening corresponding to a shape of the contact probe, on the sacrificial layer; forming a third layer of the electrode pad and a column portion and a front end of the contact probe by filling a conductive material into the third opening and the fourth opening; laminating and assembling the plurality of unit plates through the processes; and removing the sacrificial layer below the contact probe after the entire front end and the part of the column portion protrude to the outside of the substrate by removing the substrate and the part of the mold layer.

The sacrificial layer may be made of an insulating material, and the second opening may be formed at an end of the base layer contacting the interconnecting layer.

The manufacturing method of a probe card may further include exposing a part of the sacrificial layer by forming a fifth opening in the mold layer after forming the column portion and the front end of the contact probe. The fifth openings may be formed at the left and right sides of the column portion one by one and formed at the left and right sides of the front end one by one.

The manufacturing method of a probe card may further include forming a recess portion and an insulating layer at a position corresponding to the contact probe of a rear side of the substrate after forming the fifth opening, and forming a lubricating layer by coating a conductive material on the insulating layer.

On the other hand, the manufacturing method of a probe card may further include forming a side wall between the contact probes above the mold layer after forming the insulating layer on the rear side of the unit plate and forming the fifth opening. The mold layer and the side wall may be made of photoresist materials.

The manufacturing method of a probe card may further include forming at least two through-holes passing through the substrate and the mold layer before laminating the plurality of unit plates. At least two through-holes may have the same size at the same position with respect to the plurality of unit plates.

When the plurality of unit plates are assembled, a first protection plate may be disposed at the outside of a top unit plate, and a second protection plate may be disposed at the outside of a lowest unit plate. The plurality of unit plate and the first and second protection plates may be integrally fixed by using a fixing member after laminating the plurality of unit plates.

A base layer may be formed to have a distance from the end of the substrate, and a sixth opening surrounding the entire front end and a part of the column portion in the substrate and the mold layer is formed after forming the column portion and the front end of the contact probe. Further, the substrate and the mold layer may be cut along a cutting line parallel to one side of the sixth opening facing the protrusion after assembling the plurality of unit plates.

The substrate may have an initial thickness of 400 μm or more, and the adjacent unit plate may be inserted into a space by forming the space and the insulating layer at the rear center of the substrate before assembling the plurality of unit plates.

A part of the contact probe may protrude to the outside of the substrate by cutting edges of the substrate and the mold layer after fixing the plurality of unit plates, and the plurality of unit plates may be sequentially cut so that a cutting line of the adjacent unit plate is positioned outside as compared with the cutting line of the top unit plate with respect to the edge of the substrate contacting the electrode pad.

Advantageous Effects

According to an embodiment of the present invention, in the probe card, the number of contact probes may be efficiently increased without difficulty due to a manufacturing process, by increasing the number of unit plates instead of increasing the number of contact probes provided in one unit plate. Further, since the pitch of the electrode pad needs not to be decreased according to the increase in the number of contact probes, a process margin may be secured during the manufacturing of the probe card, and the probe card may easily correspond to an electrode pitch of a known commercialized tester while an operation of changing or modifying the tester may be minimized.

DESCRIPTION OF THE DRAWINGS

FIGS. 5 to 14 are process diagrams illustrating a first manufacturing method of a probe card according to the present invention.

MODE FOR INVENTION

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Figure 1:
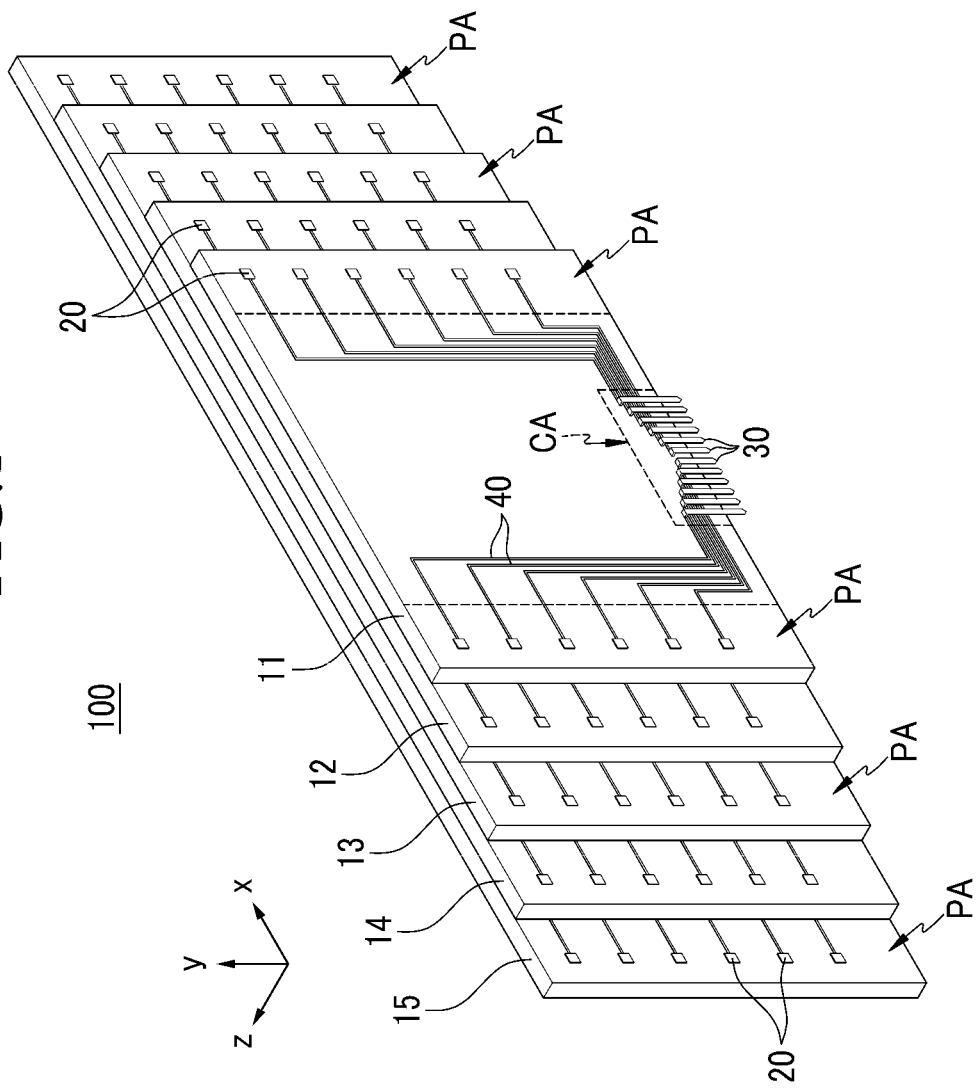
FIG. 1 is a perspective view illustrating a probe card according to a first exemplary embodiment of the present invention.
Figure 2:
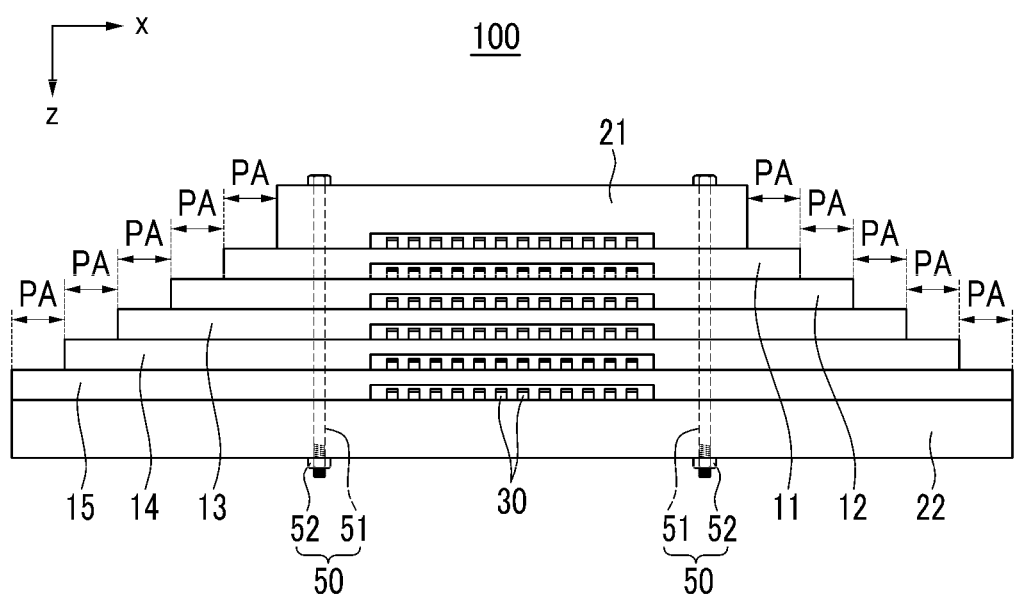
FIG. 2 is a bottom view of the probe card illustrated in FIG. 1.

FIG. 1 is a perspective view illustrating a probe card according to a first exemplary embodiment of the present invention, and FIG. 2 is a bottom view of the probe card illustrated in FIG. 1.

Referring to FIGS. 1 and 2, a probe card 100 of the first exemplary embodiment has a structure in which a plurality of unit plates 11 to 15 having different sizes is laminated. In FIGS. 1 and 2, five unit plates are illustrated as an example, but the number of unit plates is not limited to the illustrated example and may be variously modified.

In each of the unit plates 11 to 15, a plurality of electrode pads 20, a plurality of contact probes 30, and a plurality of interconnecting layers 40 are formed. In addition, an electric circuit (not illustrated) having various functions such as an inspection function, for example, an inspection circuit may be provided at the center of each of the unit plates 11 to 15. Accordingly, the probe card 100 has a structure integrated with the inspection circuit.

The electrode pad 20 is a portion which is electrically connected with a tester embedded with a measuring device, and the contact probe 30 is a portion which is in contact with the electrode pad of the semiconductor chip which is an inspection target to be electrically connected with the electrode pad. To this end, the contact probe 30 is positioned to protrude outward from the unit plates 11 to 15. The electrode pad 20 and the contact probe 30 have the same number, and each interconnecting layer 40 is formed between the electrode pad 20 and the contact probe 30 to connect the electrode pad 20 and the contact probe 30 one-on-one. Further, each interconnecting layer 40 is formed between the electrode pad 20 and the electric circuit to connect the electrode pad 20 and the electric circuit, and formed between the electric circuit and the contact probe 30 to connect the electric circuit and the contact probe 30.

Each of the unit plates 11 to 15 may have a quadrangle, for example, a rectangle. In addition, each of the unit plates 11 to 15 includes two pad areas PA and at least one contact probe area CA. The pad area PA means an area where the plurality of electrode pads 20 is positioned, and the contact probe area CA means an area where the plurality of contact probes 30 is positioned.

Two pad areas PA are positioned at two sides of the unit plates 11 to 15 which face each other in a first direction (x-axial direction of the drawing). The contact probe area CA is positioned on any one side of two sides of the unit plates 11 to 15 which face each other in a second direction (y-axial direction of the drawing). The first direction and the second direction are perpendicular to each other. In FIG. 1, one contact probe area CA is positioned at the lower center of each of the unit plates 11 to 15, but the number of contact probe areas CA is not limited to the illustrated example and may be provided in plural.

The plurality of unit plates 11 to 15 may include contact probe areas CA having the same width and contact probes 30 having the same number. Further, the plurality of unit plates 11 to 15 is arranged so that the plurality of contact probes 30 is positioned in a row in a thickness direction (z-axial direction of the drawing) of each of the unit plates 11 to 15.

Accordingly, in the probe care 100, the number of contact probes 30 is increased doubly by the number of unit plates 11 to 15, and the increased number of contact probes 30 is not distributed but concentrated in a predetermined area to be high-densely arranged. That is, when the plurality of unit plates 11 to 15 is laminated, the positions of the contact probe areas CA coincide with each other in a thickness direction of the unit plates 11 to 15, and as a result, as illustrated in FIG. 2, the plurality of contact probes 30 may be high-densely arranged in an area having a predetermined horizontal width and a predetermined vertical width.

As such, in the probe card 100, the number of contact probes 30 may be efficiently increased without difficulty due to a manufacturing process, by increasing the number of unit plates 11 to 15 instead of increasing the number of contact probes provided in one unit plate.

In this case, the plurality of unit plates 11 to 15 may include pad areas PA having the same width, and two unit plates which are adjacent to each other in the plurality of unit plates 11 to 15 may have a difference in a size by two pad areas PA.

That is, in FIGS. 1 and 2, when a unit plate having the smallest size is a first unit plate 11 and a unit plate bordering the first unit plate 11 is a second unit plate 12, a size of the second unit plate 12 is equal to a size obtained by adding a size of two pad areas PA to a size of the first unit plate 11.

In other words, the second unit plate 12 is formed in a shape where a width of the center is extended so that a distance between two pad areas PA is equal to the entire width (with according to an x-axial direction) of the first unit plate 11. Accordingly, the pad area PA of the second unit plate 12 is not overlapped with the first unit plate 11, but is positioned to protrude to the outside of the first unit plate 11.

The extension of the width of the unit plates 11 to 15 and the protrusion structure of the pad area PA according thereto are equally applied to a third unit plate 13 contacting the second unit plate 12, a fourth unit plate 14 contacting the third unit plate 13, and a fifth unit plate 15 contacting the fourth unit plate 14.

As a result, in all the plurality of unit plates 11 to 15, the pad area PA of each of the unit plates 11 to 15 is not overlapped with the adjacent unit plate, but is positioned to protrude to the outside of the adjacent unit plate. Accordingly, the electrode pads 20 of all the unit plates 11 to 15 are exposed outside to be electrically connected with the tester.

As described above, the pad areas PA are divided into two in each of the unit plates 11 to 15, and simultaneously, the plurality of pad areas PA is sequentially extended, and as a result, even if the number of electrode pads 20 is increased due to increase of the number of contact probes 30, a pitch of the electrode pad 20 (a distance between the centers of the electrode pads) may be largely secured.

That is, based on FIG. 1, since the electrode pads 20 are separated from each other in the second direction (x-axial direction) and the first direction (y-axial direction), in the probe card 100, the increased electrode pads 20 may be widely distributed in both the first direction and the second direction.

Accordingly, since the pitch of the electrode pad 20 needs not to be decreased according to the increase in the number of contact probes 30, a process margin may be secured during the manufacturing of the probe card 100, and the probe card 100 may easily correspond to an electrode pitch of a known commercialized tester while an operation of changing or modifying the tester may be minimized.

Figure 3:
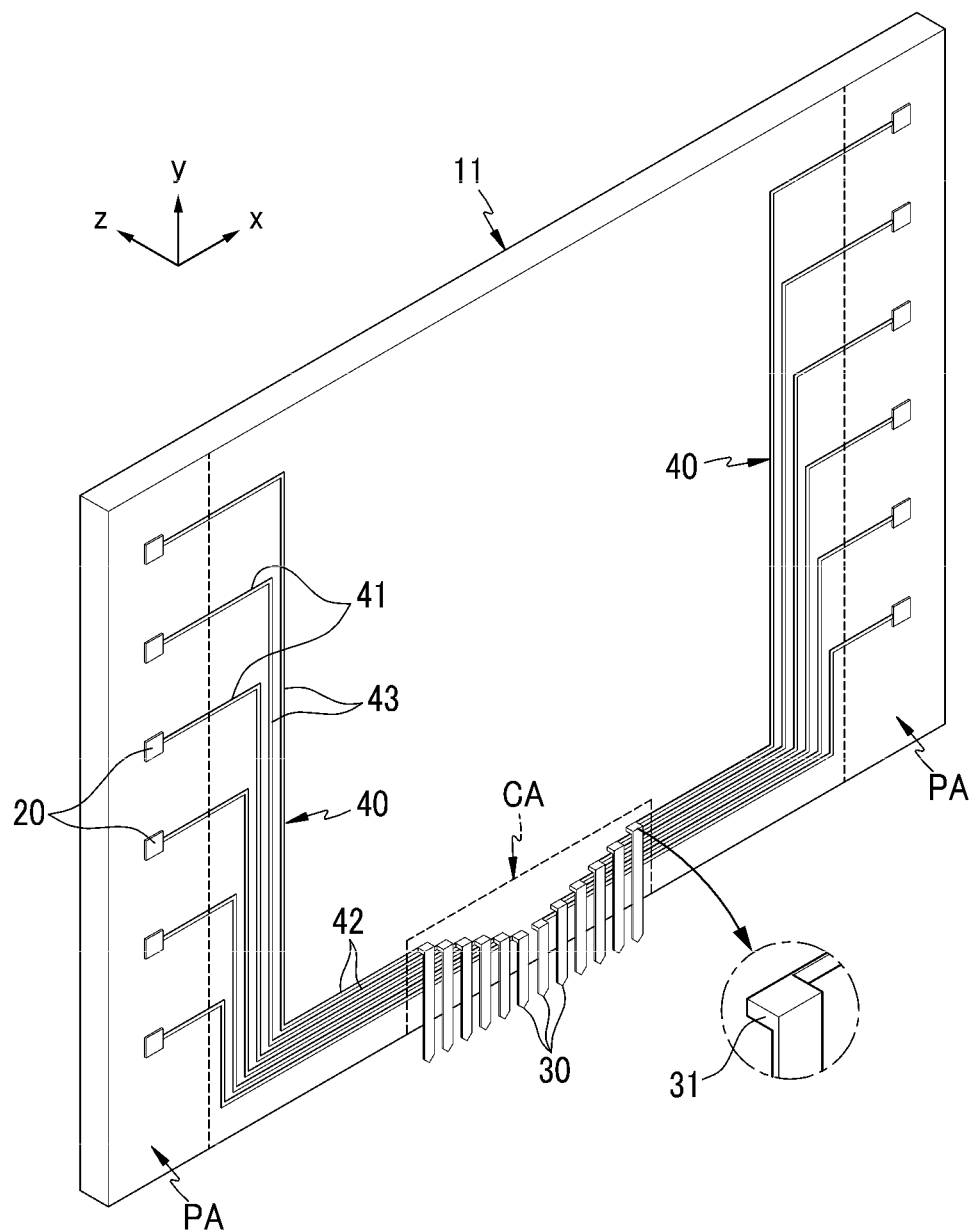
FIG. 3 is a perspective view of a first unit plate of the probe care illustrated in FIG. 1.

FIG. 3 is a perspective view of a first unit plate of the probe care illustrated in FIG. 1.

Referring to FIG. 3, since the pad areas PA are divided into two, the plurality of electrode pads 20, the plurality of interconnecting layers 40, and the plurality of contact probes 30 may have bilateral symmetry. Here, the bilateral direction is a direction coinciding with a first direction (x-axial direction).

The contact probe 30 includes a protrusion 31 having a predetermined thickness at an end contacting the interconnecting layer 40. As a result, the contact probe 30 is separated from the surface of the first unit plate 11 by a thickness of the protrusion 31. Further, since the contact probe 30 needs to contact the electrode pad of the semiconductor chip, a part of the contact probe 30 protrudes to the outside from the end of the first unit plate 11 in a second direction (y-axial direction).

The interconnecting layers 40 are formed to connect the electrode pads 20 arranged in the second direction (y-axial direction) and the contact probes 30 arranged in the first direction (x-axial direction) one-on-one. To this end, the interconnecting layer 40 may be configured by a first horizontal portion 41 contacting the electrode pad 20, a second horizontal portion 42 contacting the contact probe 30, and a connector 43 connecting the first horizontal portion 41 and the second horizontal portion 42. The first horizontal portion 41 and the second horizontal portion 42 is parallel to the first direction (x-axial direction), and the connector 43 may be parallel to the second direction (y-axial direction) or positioned obliquely at a predetermined slope.

A pitch of the first horizontal portion 41 is larger than a pitch of the second horizontal portion 42. Further, a pitch of the connector 43 may be set to be equal to the pitch of the second horizontal portion 42 or set as an intermediate value between the pitch of the first horizontal portion 41 and the pitch of the second horizontal portion 42. In FIG. 3, a case where the pitch of the connector 43 is set as the intermediate value between the pitch of the first horizontal portion 41 and the pitch of the second horizontal portion 42 is illustrated as an example.

In this case, with respect to the plurality of interconnecting layers 40 extended from the plurality of electrode pads 20 positioned in any one pad area PA, the second horizontal portions 42 have different lengths so that the contact probes 30 are not overlapped with each other. Further, the ends of the second horizontal portions 42 have different heights (or positions) in the second direction (y-axial direction), and as a result, the plurality of contact probes 30 have different lengths.

That is, since positions of ends of the plurality of contact probes 30 which contact the semiconductor chip are the same as each other, the contact probe 30 have a difference in a length from the adjacent contact probe 30 by the height of the second horizontal portion 42.

In FIG. 3, a case where the contact probe 30 which is positioned at the outermost side among the plurality of contact probes 30 has the largest length, and the second horizontal portion 42 connected with the contact probe 30 has the smallest length is illustrated as an example. However, on the contrary to this, that is, the contact probe 30 which is positioned at the outermost side among the plurality of contact probes 30 may have the smallest length, and the second horizontal portion 42 connected with the contact probe 30 may have the largest length.

The plurality of unit plates 11 to 15 may smoothly connect the plurality of contact probes 30 with the plurality of electrode pads 20 having different pitches due to the structure of the interconnecting layer 40.

Referring back to FIG. 2, the probe card 100 of the first exemplary embodiment may further include a first protection plate 21 positioned at the outside of the first unit plate 11 which a top unit plate, and a second protection plate 22 positioned at the outside of the fifth unit plate 15 which is a lowest unit plate.

The first protection plate 21 has a smaller size than the first unit plate 11 to expose the pad area PA of the first unit plate 11. The second protection plate 22 may have the same size as the fifth unit plate 15. The first and second protection plates 21 and 22 have a larger thickness than the thickness of each of the unit plates 11 to 15 and are manufactured by a hard and solid material to cover and protect the plurality of unit plates 11 to 15 at the outside of the plurality of unit plates 11 to 15.

The plurality of unit plates 11 to 15 and the first and second protection plates 21 and 22 are arranged to be integrally fixed to a fixing member 50. The fixing member 50 may be configured by an assembly of at least two bolts 51 passing through the plurality of unit plates 11 to 15 and the first and second protection plates 21 and 22, and nuts 52 coupled with the bolts 51. In this case, at least two through-holes for passing through the bolts are formed in the plurality of unit plates 11 to 15 and the first and second protection plates 21 and 22.

On the other hand, the fixing member 50 may be configured by an adhesive layer (not illustrated) which is positioned between the first protection plate 21 and the first unit plate 11, between the plurality of unit plates 11 to 15, and between the fifth unit plate 15 and the second protection plate 22. On the other hand, the fixing member 50 may include both the adhesive layer and the assembly of the bolts 51 and the nuts 52.

In FIG. 2, the fixing member 50 configured by the assembly of the bolts 51 and the nuts 52 is illustrated as an example, but the fixing member 50 is not limited to the illustrated example, and all configurations capable of integrally fixing the plurality of unit plates 11 to 15 and the first and second protection plates 21 and 22 may be applied as the fixing member 50.

Meanwhile, in FIGS. 1 and 3, the plurality of interconnecting layers 40 formed at each of the unit plates 11 to 15 protrude outside, but the plurality of interconnecting layers 40 may be covered by a mold layer (not illustrated). The mold layer will be described in detail in a manufacturing method of a probe card.

Figure 4:
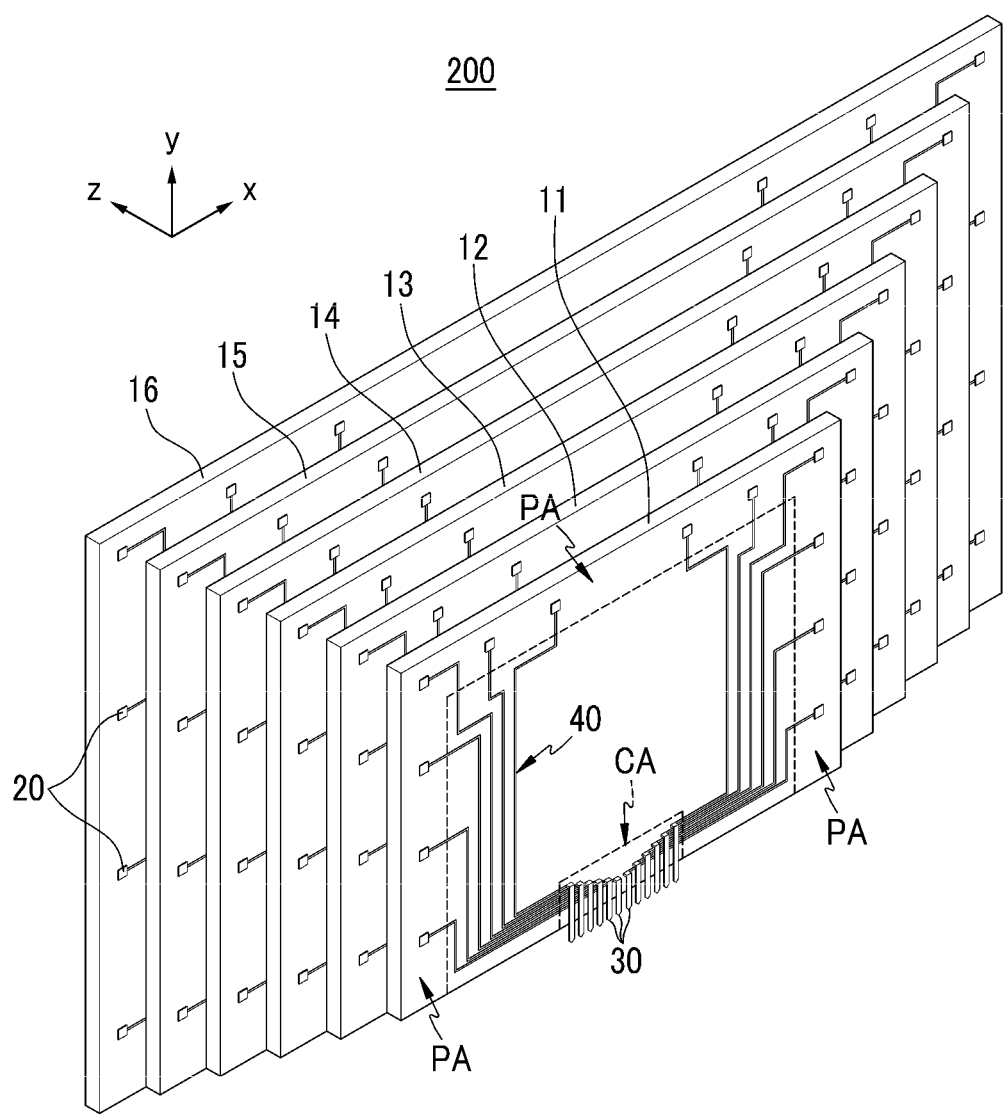
FIG. 4 is a perspective view illustrating a probe card according to a second exemplary embodiment of the present invention.

FIG. 4 is a perspective view illustrating a probe card according to a second exemplary embodiment of the present invention.

Referring to FIG. 4, a probe card 200 of the second exemplary embodiment has the same configuration as the probe card 100 of the first exemplary embodiment, except that three pad areas PA are formed in each of unit plates 11 to 16 and two adjacent unit plates have a size difference by the three pad areas PA. The same members as the first exemplary embodiment use the same reference numerals, and differences from the first exemplary embodiment will be mainly described.

In the probe card 200 of the second exemplary embodiment, each of the unit plates 11 to 16 includes pad areas PA formed at two sides which face each other in a first direction (x-axial direction) and one side which faces a contact probe area CA in a second direction (y-axial direction). In addition, the plurality of electrode pads 20 is arranged in the pad areas PA with a predetermined pitch.

A large unit plate of the two adjacent unit plates is formed with the same size obtained by adding a size of three pad areas PA itself to a size of a small unit plate. Accordingly, the pad area PA formed in the large unit plate is not overlapped with the small unit plate, but protrudes to the outside of the small unit plate.

In the probe card 200 of the second exemplary embodiment including the three pad areas PA in each of the unit plates 11 to 16, since a pitch of the electrode pad 20 due to extension of the pad area PA and a pitch of the interconnecting layer 40 may be larger than those of the first exemplary embodiment, a process margin during manufacturing of the probe card 200 may be further secured.

Meanwhile, in FIGS. 1 to 4, a shape of which the contact probe 30 has a predetermined width is schematically illustrated, but the contact probe 30 may have a variable rigid structure as follows.

Hereinafter, a manufacturing method of the probe card will be described with reference to FIGS. 5 to 18.

Figure 14:
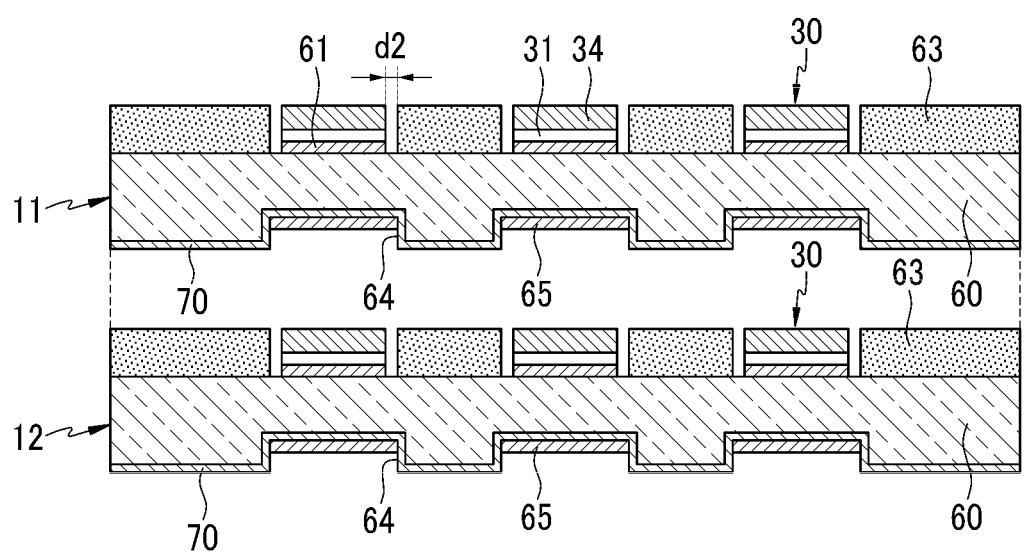
Figure 15:
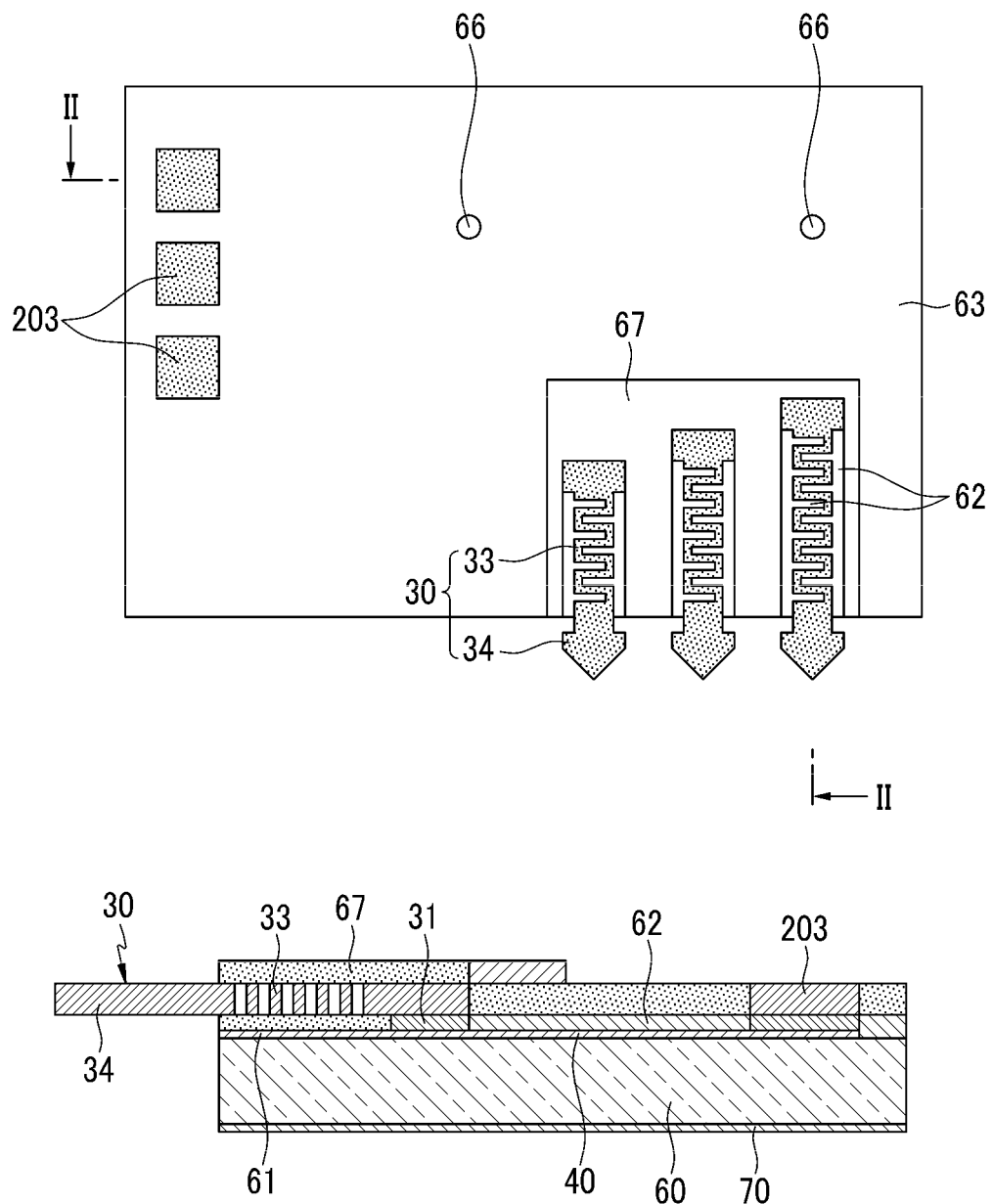
FIGS. 15 and 16 are process diagrams illustrating a second manufacturing method of a probe card according to the present invention.
Figure 16:
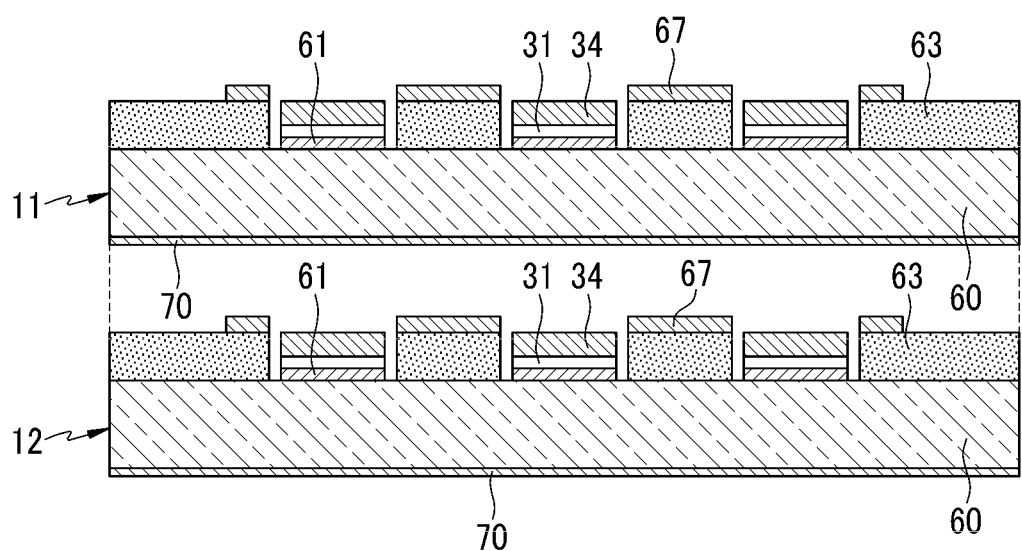
Figure 17:
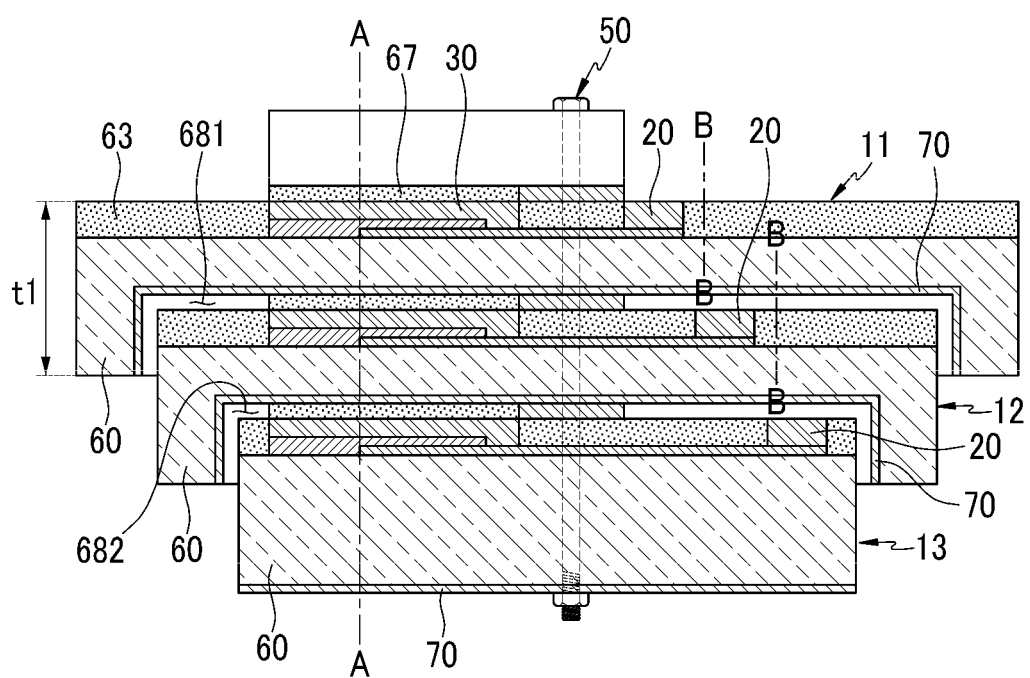
FIGS. 17 and 18 are process diagrams illustrating a third manufacturing method of a probe card according to the present invention.
Figure 18:
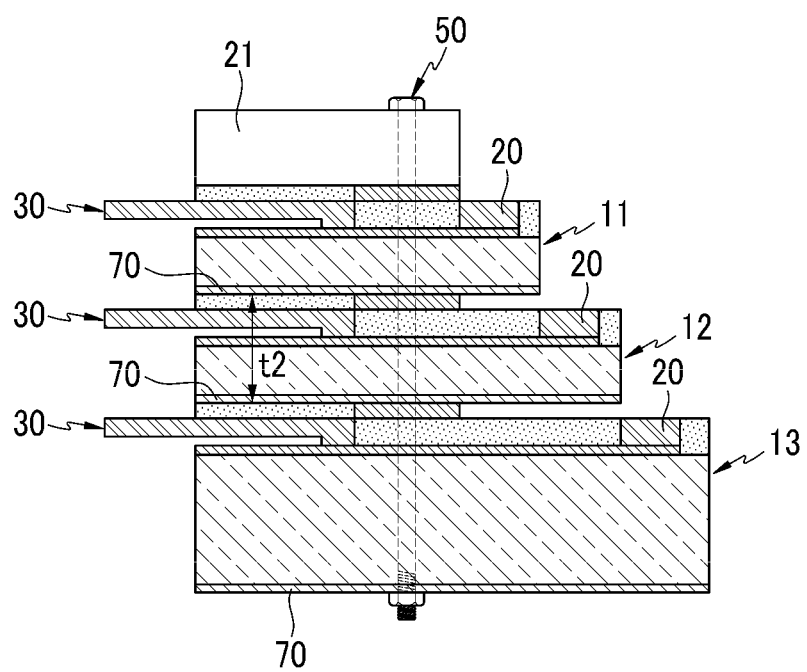

FIGS. 5 to 14 are process diagrams illustrating a first manufacturing method of a probe card according to the present invention, FIGS. 15 and 16 are process diagrams illustrating a second manufacturing method of a probe card according to the present invention, and FIGS. 17 and 18 are process diagrams illustrating a third manufacturing method of a probe card according to the present invention.

For convenience of description, FIGS. 5 to 18 schematically illustrate shapes of the interconnecting layers and the contact probes, and actually, the shapes of the interconnecting layers and the contact probes are formed to be the same as those illustrated in FIGS. 1 to 4. In addition, FIGS. 5 to 13 and 15 illustrate plan views and cross-sectional views of the probe card together, and the cross-sectional views illustrate sections taken along line II-II of the plan views.

Referring to FIG. 5, a first layer 201 of the electrode pad, an interconnecting layer 40, and a base layer 61 are integrally formed by forming a conductive layer on a substrate 60 and patterning the formed conductive layer. The base layer 61 is a region in which a protrusion of the contact probe is formed later and a region which is overlapped with a column portion of the contact probe. The base layer 61 is positioned at a predetermined distance G from an end of the substrate 60. The conductive layer is made of metal, for example, may be formed by a laminated layer made of gold (Au) and titanium (Ti).

Referring to FIG. 6, a first opening 71 exposing the first layer 201 of the electrode pad and a second opening 72 exposing a part of the base layer 61 are formed by forming a sacrificial layer 62 on the substrate 60 to cover the first layer 201, the interconnecting layer 40, and the base layer 61 and patterning the formed sacrificial layer 62. The second opening 72 is formed at an end of the base layer 61 contacting the interconnecting layer 40 and corresponds to a position of a protrusion of the contact probe to be formed later. The sacrificial layer 62 is made of an insulating material, and for example, may be made of silicon oxide.

Referring to FIG. 7, a second layer 202 of the electrode pad and a protrusion 31 of the contact probe are formed by filling a conductive material in the first opening 71 and the second opening 72 of the sacrificial layer 62. The conductive material may include a metallic material, for example, nickel (Ni).

Figure 8:
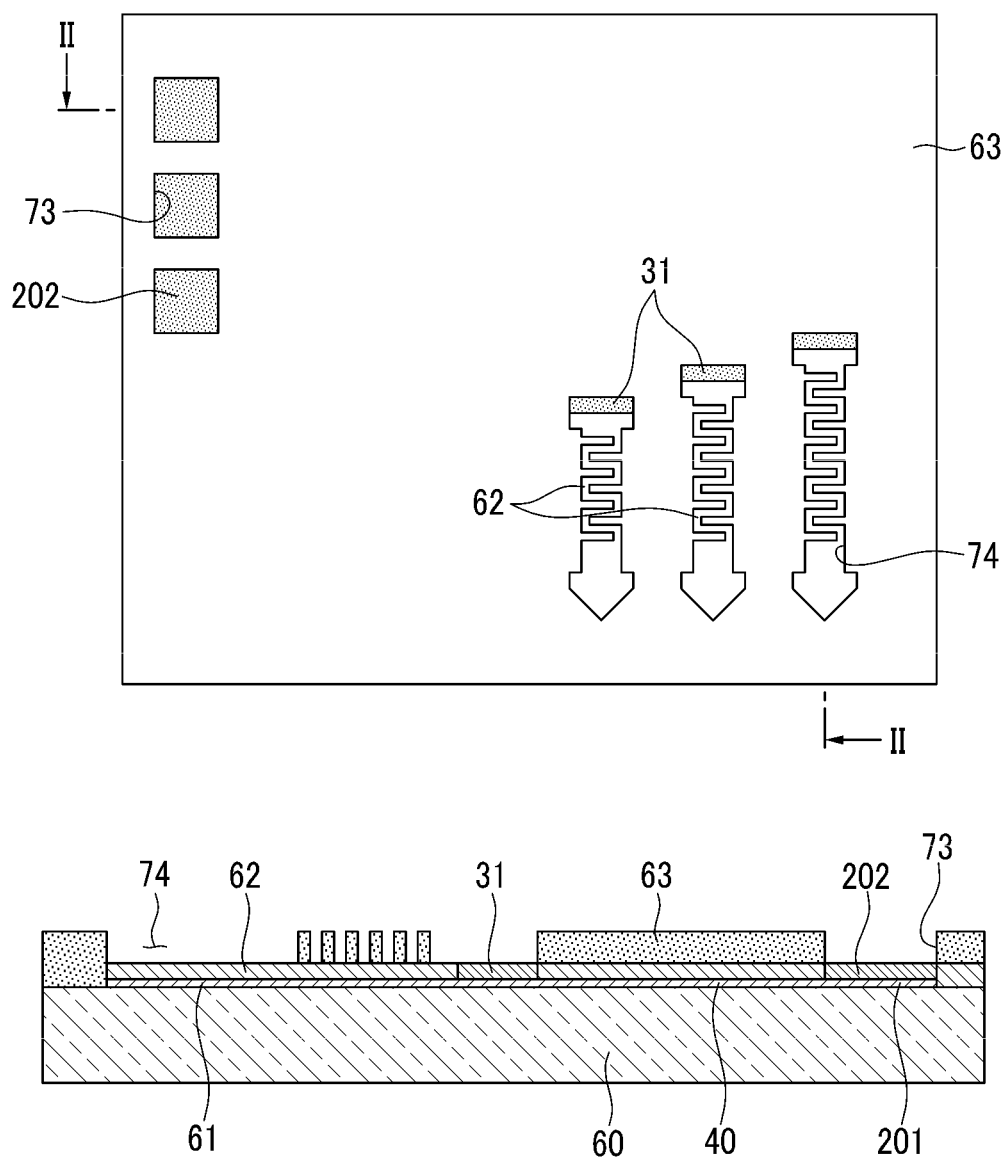

Referring to FIG. 8, a third opening 73 exposing the second layer 202 of the electrode pad and a fourth opening 74 corresponding to a shape of the contact probe are formed by forming a mold layer 63 on the entire substrate 60 to cover the sacrificial layer 62 and patterning the formed mold layer 63. The fourth opening 74 exposes the protrusion 31 and the sacrificial layer 62 and has a shape corresponding to a column portion and a front end of the contact probe. The mold layer 63 may be made of a photoresist material and serves as a mold for forming the contact probe.

Figure 9:
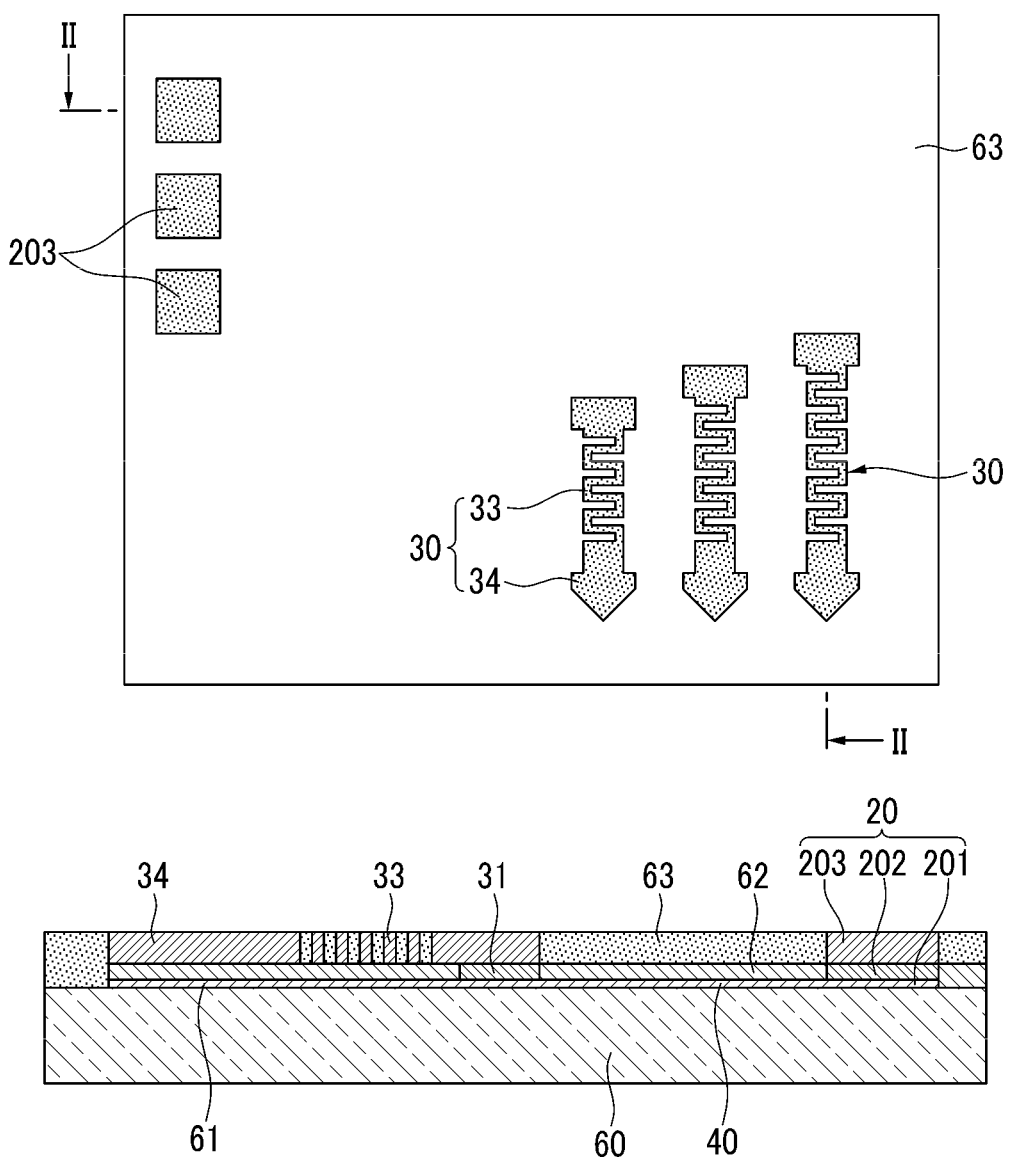

Referring to FIG. 9, a third layer 203 of the electrode pad and a column portion 33 and a front end 34 of the contact probe 30 are formed by filling a conductive material in the third opening 73 and the fourth opening 74 of the mold layer 63. The conductive material may include a metallic material, for example, nickel (Ni). As a result, the electrode pad 20 configured by the first layer 201, the second layer 202, and the third layer 203, and the contact probe 30 configured by the protrusion 31, the column portion 33, and the front end 34.

Figure 10:
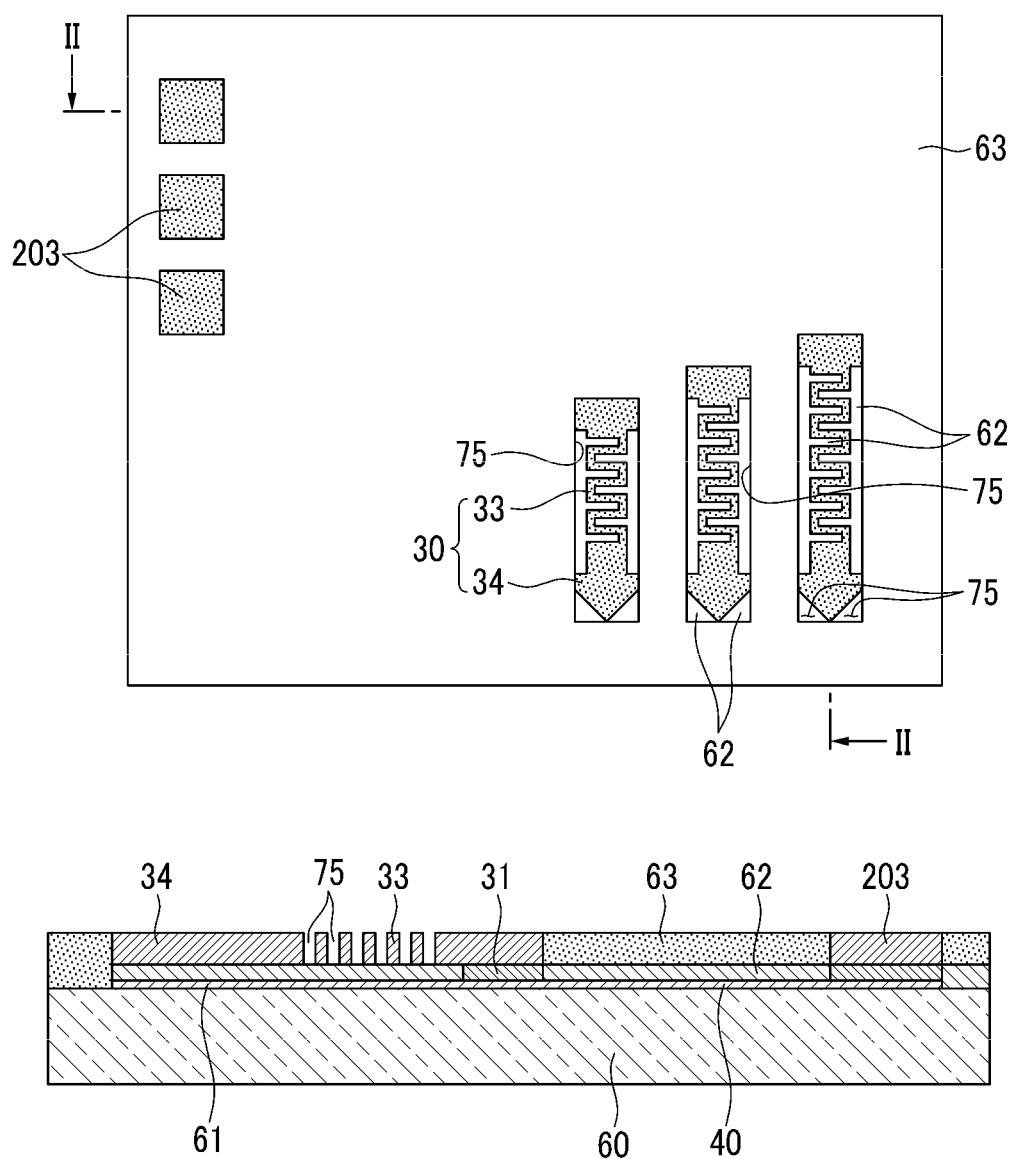

Referring to FIG. 10, a fifth opening 75 exposing the sacrificial layer 62 around the contact probe 30 is formed by patterning the mold layer 63. The fifth openings 75 are formed at the left and right sides of the column portion 33 one by one and may be formed at the left and right sides of the front end 34 one by one. The fifth opening 75 of the mold layer 63 provides an extra space in which the contact probe 30 may be deformed later in a width direction and a length direction of the contact probe 30.

Referring to FIG. 11, a recess portion 64 is formed at a position corresponding to the contact probe 30 of the rear side of the substrate 60, and an insulating layer 70 is formed on the surface of the recess portion 64. Further, a lubricating layer 65 is formed by coating a conductive material on the insulating layer 70. The lubricating layer 65 may include gold (Au). The recess portion 64 faces the contact probe 30 of the adjacent unit plate when laminating the plurality of unit plates, and provides an extra space in which the contact probe 30 may be deformed in a thickness direction of the unit plate (see FIG. 14).

The contact probe 30 contacts the base layer 61 of the corresponding unit plate while the column portion 33 moves in use or contacts the lubricating layer 65 of the adjacent unit plate. The lubricating layer 65 includes the same component as the base layer 61 so that friction between the contact probe 30 and the base layer 61 is the same as friction between the contact probe 30 and the lubricating layer 65. Accordingly, the lubricating layer 65 serves to facilitate an operation of the contact probe 30 and increase a lifespan of the contact probe 30.

Subsequently, at least two through-holes 66 passing through the substrate 60 and the mold layer 63 are formed. In FIG. 11, two through-holes 66 are schematically illustrated, but actually, the through-holes 66 are formed at upper, lower, left, and right edges of the electrode pad 20 one by one in a rectangular substrate and may be formed at upper, lower, left, and right edges of the electrode pad 20 one by one in the inside of the interconnecting layer 40.

The through-holes 66 are formed with the same size at the same position with respect to the plurality of unit plates having different sizes. The through-holes 66 are formed in the case where the fixing member 50 fixing the plurality of unit plates is configured by the assembly of the bolts 51 and the nuts 52, and in the case where the fixing member 50 is configured by only the adhesive layer, a forming operation of the through-holes 66 is omitted.

Referring to FIG. 12, a sixth opening 76 is formed by removing a portion surrounding the entire front end 34 and a part of the column portion 33 of the contact probe 30 of the substrate 60 and the mold layer 63 by etching. In this case, the sacrificial layer 62 below the column portion 33 and the front end 34 is not removed but remains.

In this process, the reason why the substrate 60 and mold layer 63 portions outside the front end 34 are not removed but remain is for protecting the contact probes 30 during a subsequent assembling process and facilitating handling of the unit plates.

Referring to FIGS. 13 and 14, the unit plates 11 and 12 through the aforementioned processes are arranged, and the plurality of unit plates is integrally fixed by using a fixing member (not illustrated). Thereafter, the entire front end 34 and the part of the column portion 33 protrude outside the substrate 60 by cutting the substrate 60 and mold layer 63 along a cutting line parallel to a side of the sixth opening 76 facing the protrusion 31. In addition, the sacrificial layer 62 below the contact probe 30 is removed by etching to complete the probe card.

Accordingly, the contact probe 30 may be deformed in a thickness direction of the substrate 60 when receiving external force, and the column portion 33 maintains a predetermined distance d2 (see FIG. 14) from the mold layer 63 to be deformed in a width direction and a length direction of the contact probe 30 when receiving external force.

Meanwhile, in the probe card, a side wall may be formed between the contact probes 30 above the mold layer 63, instead of forming the recess portion 65 at the rear side of the substrate 60. Referring to FIGS. 15 and 16, only the insulating layer 70 instead of the recess portion is formed on the rear side of the substrate 60, and a side wall 67 having a predetermined thickness is formed between the contact probes 30. The side wall 67 may be formed in the entire contact probe area and may be formed of the same material as the mold layer 63.

The side wall 67 is positioned between the contact probes 30 above the mold layer 63 of each unit plate, and as a result, a space is formed by the rear side of the substrate 60 and the side wall 67 of the adjacent unit plate. Accordingly, the side wall may provide an extra space in which the contact probe 30 may be deformed in a thickness direction of the unit plate.

Meanwhile, in the aforementioned first exemplary embodiment and second exemplary embodiment, the sum of thicknesses of the substrate 60 and the mold layer 63 of each unit plate is approximately 50 μm or less, and as a result, difficulty in handling due to an extremely thin thickness may occur.

Referring to FIGS. 17 and 18, the substrate 60 having a thickness of approximately 400 μm or more is prepared, and the sacrificial layer 62, the mold layer 63, and the contact probe 30 are formed on the substrate 60 through the processes of the first exemplary embodiment or the second exemplary embodiment. Then, it is possible to facilitate the handling of the substrate 60 in the aforementioned processes due to the large thickness of the substrate 60. In FIG. 17, the sum of the thicknesses of the substrate 60 and the mold layer 63 is represented by t1, and the t1 may be approximately 500 μm. In this case, the substrate may first be a single wafer or a silicon on insulator (SOI) wafer having a thickness of 400 μm or more.

In FIGS. 17 and 18, a case where the side wall 67 is positioned between the contact probes 30 is illustrated as an example. Further, FIGS. 17 and 18 illustrate three unit plates 11 to 13 as a schematic diagram for describing a manufacturing method of the probe card, but the number of unit plates is not limited to the illustrated example.

Before assembling the plurality of unit plates 11 to 13, a space where the adjacent unit plates may be inserted is formed by etching the rear center of the substrate 60. In this case, the insulating layer 70 is formed every space. That is, the second unit plate 12 is inserted into a first space 681 by forming the first space 681 and the insulating layer 70 at the rear center of the first unit plate 11. Further, the third unit plate 13 is inserted into a second space 682 by forming the second space 682 and the insulating layer 70 at the rear center of the second unit plate 12. The structure is applied to all the rest unit plates except for the lowest unit plate.

The entire front end 34 of the a part of the column portion 33 of the contact probe 30 protrudes to the outside of the substrate 60 by fixing the plurality of unit plates 11 to 13 by using the fixing member 50 after laminating the plurality of unit plates 11 to 13 and cutting the substrate 60 and the mold layer 63 along a cutting line parallel to one side of the sixth opening 76 (see FIG. 12) facing the protrusion 31. In this case, the cutting line is illustrated as line A-A (see FIG. 17).

Subsequently, the electrode pads 20 of all the unit plates are exposed outside by cutting sequentially the plurality of unit plates so that the cutting line of the next unit plate 12 is positioned outside as compared with the top unit plate 11 with respect to an edge of the substrate 60 contacting the electrode pad 20. In this case, the cutting line is illustrated as line B-B (see FIG. 17). In addition, the sacrificial layer 62 below the contact probe 30 is removed by etching to complete the probe card.

Then, as illustrated in FIG. 18, in the completed probe card, a sum t2 of thicknesses of the substrate 60 and the mold layer 63 is approximately 50 μm or less, and as a result, a distance between the contact probes 30 according to a thickness direction of the probe card may be maintained at 50 μm or less.

As such, according to the third exemplary embodiment of the probe card, it is possible to facilitate handling of the substrate 60 in a manufacturing process by forming the sacrificial layer 62, the mold layer 63, and the contact probe 30 on the substrate 60 having a large thickness and cutting and removing the edge of the substrate 60 after assembling the plurality of unit plates 11 to 13.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

The invention claimed is:

1. A probe card, comprising:
   a plurality of unit plates including pad areas and contact probe areas;
   a plurality of electrode pads formed in the pad areas;
   a plurality of contact probes formed in the contact probe areas; and
   a plurality of interconnecting layers electrically connecting the electrode pads and the contact probes,
   wherein the pad areas are positioned at ends of the unit plates,
   the plurality of unit plates have different sizes and are laminated in a thickness direction of each of the unit plates and sequentially arranged by size so as to expose all the pad areas of each unit plate, and
   each of the unit plates which is adjacent to each other in the plurality of unit plates has a difference in a size by the pad areas so that the pad areas of each of the unit plates are not overlapped by an adjacent unit plate.

2. The probe card of claim 1, wherein:
   the contact probe areas have the same width and the plurality of contact probes have the same number in the plurality of unit plates.

3. The probe card of claim 2, wherein:
   the plurality of unit plates is arranged so that the plurality of contact probes is positioned in a row in a thickness direction of each of the unit plates.

4. The probe card of claim 3, wherein:
   the unit plate has a recess portion formed on the rear side facing the contact probe of the adjacent unit plate.

5. The probe card of claim 4, wherein:
   the plurality of unit plates further includes an insulating layer positioned on the recess portion and a lubricating layer positioned on the insulating layer and made of a conductive material.

6. The probe card of claim 3, wherein:
the plurality of unit plates further includes an insulating layer formed on the rear side facing the adjacent unit plate and a side wall positioned between the plurality of contact probes.

7. The probe card of any one of claim 1, wherein:
the plurality of unit plates further includes an inspection circuit, and the interconnecting layers are positioned between the electrode pad and the inspection circuit and between the inspection circuit and the contact probe.

8. A probe card, comprising:
a plurality of unit plates including pad areas and contact probe areas and having different sizes, in which the contact probe areas are overlapped with each other and laminated in a thickness direction of each of the unit plates and sequentially arranged by size so that all the pad areas are exposed;
a plurality of electrode pads formed in the pad areas;
a plurality of contact probes formed in the contact probe areas; and
a plurality of interconnecting layers electrically connecting the electrode pads and the contact probes,
wherein in the plurality of unit plates, the pad areas are formed at two sides facing each other in a first direction, and the contact probe area is formed at any one side of two sides facing each other in a second direction perpendicular to the first direction, and
wherein each of the unit plates which is adjacent to each other in the plurality of unit plates has a difference in a size by the pad areas so that the pad areas of each of the unit plates are not overlapped by an adjacent unit plate.

9. The probe card of claim 8, wherein:
the plurality of unit plates includes a first unit plate and a second unit plate contacting the first unit plate, and
a size of the second unit plate is equal to a sum obtained by adding a size of the two pad areas to the size of the first unit plate.

10. The probe card of claim 8, wherein:
in the plurality of unit plates, the pad area is further formed at another side of the two sides facing each other in the second direction.

11. The probe card of claim 10, wherein:
the plurality of unit plates includes a first unit plate and a second unit plate contacting the first unit plate, and
a size of the second unit plate is equal to a sum obtained by adding a size of the three pad areas to the size of the first unit plate.

12. The probe card of any one of claim 8, further comprising:
a fixing member fixing integrally the plurality of unit plates.

13. The probe card of claim 12, wherein:
the fixing member includes at least one of an assembly of at least two bolts passing through the plurality of unit plates and nuts coupled with the bolts and an adhesive layer positioned between the plurality of unit plates.

14. The probe card of claim 13, further comprising:
a first protection plate positioned at the outside of a top unit plate among the plurality of unit plates and a second protection plate positioned at the outside of a lowest unit plate of the plurality of unit plates,
wherein the first protection plate and the second protection plate are integrally fixed to the plurality of unit plates by the fixing member.

15. The probe card of claim 14, wherein:
the first protection plate has a smaller size than the top unit plate, and the second protection plate has the same size as the lowest unit plate.

16. The probe card of claim 15, wherein:
the first protection plate and the second protection plate have a larger size than the each unit plate.

17. The probe card of any one of claim 8, wherein:
the plurality of electrode pads is arranged in the second direction and the plurality of contact probes is arranged in the first direction, and
the interconnecting layer includes a first horizontal portion contacting the electrode pad, a second horizontal portion contacting the contact probe, and a connector connecting the first horizontal portion and the second horizontal portion.

18. The probe card of claim 17, wherein:
the first horizontal portion and the second horizontal portion are parallel to the first direction, and the connector is parallel to the second direction or obliquely positioned in the second direction.

19. A probe card, comprising:
a plurality of unit plates including pad areas and contact probe areas and having different sizes, in which the contact probe areas are overlapped with each other and arranged and laminated so that all the pad areas are exposed;
a plurality of electrode pads formed in the pad areas;
a plurality of contact probes formed in the contact probe areas; and
a plurality of interconnecting layers electrically connecting the electrode pads and the contact probes,
wherein in the plurality of unit plates, the pad areas are formed at two sides facing each other in a first direction, and the contact probe area is formed at any one side of two sides facing each other in a second direction perpendicular to the first direction,
wherein the plurality of electrode pads is arranged in the second direction and the plurality of contact probes is arranged in the first direction, and the interconnecting layer includes a first horizontal portion contacting the electrode pad, a second horizontal portion contacting the contact probe, and a connector connecting the first horizontal portion and the second horizontal portion,
wherein the first horizontal portion and the second horizontal portion are parallel to the first direction, and the connector is parallel to the second direction or obliquely positioned in the second direction, and
wherein a pitch of the first horizontal portion is larger than a pitch of the second horizontal portion, and a pitch of the connector is equal to the pitch of the second horizontal portion or set as an intermediate value between the pitch of the first horizontal portion and the pitch of the second horizontal portion.

20. A probe card, comprising:
a plurality of unit plates including pad areas and contact probe areas and having different sizes, in which the contact probe areas are overlapped with each other and arranged and laminated so that all the pad areas are exposed;
a plurality of electrode pads formed in the pad areas;
a plurality of contact probes formed in the contact probe areas; and
a plurality of interconnecting layers electrically connecting the electrode pads and the contact probes,
wherein in the plurality of unit plates, the pad areas are formed at two sides facing each other in a first direction, and the contact probe area is formed at any one side of two sides facing each other in a second direction perpendicular to the first direction, wherein the plurality of electrode pads is arranged in the second direction and the plurality of contact probes is arranged in the first direction, and the interconnecting layer includes a first horizontal portion contacting the electrode pad, a second horizontal portion contacting the contact probe, and a connector connecting the first horizontal portion and the second horizontal portion, wherein the first horizontal portion and the second horizontal portion are parallel to the first direction, and the connector is parallel to the second direction or obliquely positioned in the second direction, and wherein the second horizontal portions have different lengths, ends of the second horizontal portions have different heights in the second direction, and the plurality of contact probes have different lengths from the adjacent contact probes.

\* \* \* \* \*